United States Patent [19]

Fujii et al.

[11] Patent Number: 5,112,766
[45] Date of Patent: May 12, 1992

[54] METHOD OF MANUFACTURING FIELD EFFECT TRANSISTORS

[75] Inventors: Takayuki Fujii; Mitsunori Nakatani, both of Itami, Japan

[73] Assignee: Mitsubishi Denki Kabushiki Kaisha, Japan

[21] Appl. No.: 730,626

[22] Filed: Jul. 16, 1991

[30] Foreign Application Priority Data

Jul. 17, 1990 [JP] Japan .................. 2-189838

[51] Int. Cl.$^5$ ............................. H01L 21/18
[52] U.S. Cl. .............................. 437/41; 437/39; 437/40; 437/44; 437/176; 437/178; 437/196; 437/912
[58] Field of Search ............. 437/29, 39, 40, 41, 437/44, 176, 178, 196, 200, 228, 22, 247, 912; 357/23.2, 23.3

[56] References Cited

U.S. PATENT DOCUMENTS

| | | | |
|---|---|---|---|
| 4,312,680 | 1/1982 | Hsu | 437/41 |
| 4,419,809 | 12/1983 | Riseman et al. | 357/23.3 |
| 4,559,693 | 12/1985 | Kamei | 437/39 |
| 4,597,827 | 7/1986 | Nishitani et al. | 357/23.3 |
| 4,729,966 | 3/1988 | Koshino et al. | 437/44 |
| 4,769,339 | 9/1988 | Ishii | 437/39 |
| 5,001,077 | 3/1991 | Sakai | 437/41 |

FOREIGN PATENT DOCUMENTS

| | | |
|---|---|---|
| 0177129 | 4/1986 | European Pat. Off. . |
| 0042151 | 3/1982 | Japan . |
| 0182171 | 9/1985 | Japan . |
| 62-33476 | 2/1987 | Japan . |
| 62-45184 | 2/1987 | Japan . |
| 62-92377 | 4/1987 | Japan . |
| 1-251667 | 10/1989 | Japan . |
| 1-304785 | 12/1989 | Japan . |

Primary Examiner—Tom Thomas
Attorney, Agent, or Firm—Leydig, Voit & Mayer

[57] ABSTRACT

A method of producing a field effect transistor includes forming a first conductivity type active layer having a first concentration of dopant impurities producing the first conductivity type in a semi-insulating semiconductor substrate, forming a mask film on the substrate on part of the first conductivity type region, depositing a gate metal film on the mask film and on the substrate not covered by the mask film, etching the gate metal film and leaving a portion of the gate metal film on the substrate adjacent to and contacting the mask film as a gate electrode, implanting dopant impurities producing a second conductivity type in the substrate using the mask film and the gate electrode as an implantation mask, annealing the substrate at an elevated temperature to activate the implanted dopant impurities whereby some of the implanted dopant impurities diffuse laterally within the substrate to produce a second conductivity type region in the substrate underneath part of the gate electrode, removing the mask film, implanting dopant impurities producing the first conductivity type in the substrate using the gate electrode as an ion implantation mask to produce first and second doped regions in the substrate on opposite sides of the gate electrode and having a second concentration of dopant impurities larger than the first concentration, the second doped region being disposed within the second conductivity type region that extends underneath part of the gate electrode, and forming a source electrode on the first doped region and a drain electrode on the second doped region.

17 Claims, 6 Drawing Sheets

FIG.3
PRIOR ART
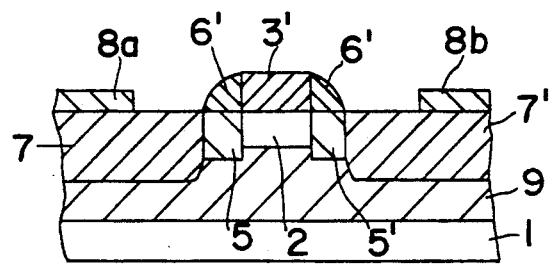
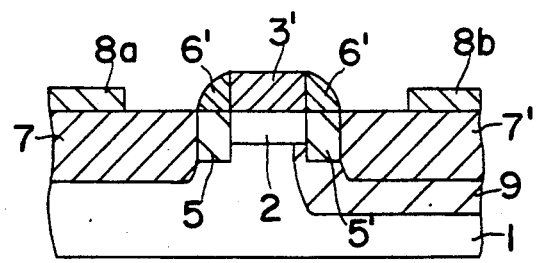
FIG.4
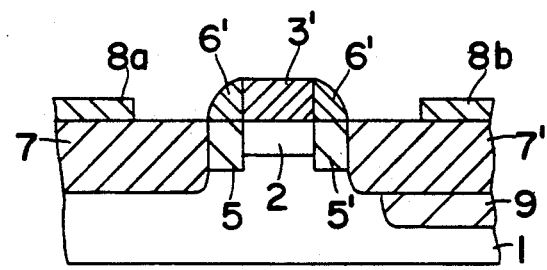
FIG.6

METHOD OF MANUFACTURING FIELD EFFECT TRANSISTORS

FIELD OF THE INVENTION

The present invention relates to a method of manufacturing field effect transistors (FETs) and particularly compound semiconductor FETs having self-aligned gates in which the short channel effect is suppressed and the capacitance between the source and gate is limited.

BACKGROUND OF THE INVENTION

A known method of making a lightly doped drain (LDD) gallium arsenide (GaAs) FET is illustrated in FIGS. 2(a)-2(g). In FIG. 2(a), a semi-insulating GaAs substrate 1 has an active layer 2, usually n-type, formed by a known technique, such as ion implantation, diffusion, or epitaxial growth As shown in FIG. 2(a), the active layer 2 appears to be disposed on the substrate 1 which is the situation when the active layer 2 is formed by epitaxial growth. Otherwise, the active layer 2 is an integral part of the substrate 1 and is disposed at a surface of the substrate In this application, the active layer 2 is referred to as part of the substrate with the understanding that it may be a distinct layer if epitaxially grown.

As illustrated in FIG. 2(b), a film 3 (not shown) of a gate metal, such as a refractory metal like tungsten (W) or a refractory metal silicide such as tungsten silicide ($WSi_x$), is deposited on the surface of the substrate 1 by a known technique, such as sputtering or vapor deposition. A photoresist film 4 (not shown) is deposited on the gate metal film 3 and patterned by conventional photolithographic processing to produce a mask 4' where a gate electrode is to be present. Thereafter, the gate metal film 3 is etched by reactive ion etching (RIE), for example, using sulfur hexafluoride ($SF_6$) or a mixture of carbon tetrafluoride ($CF_4$) and oxygen ($O_2$). After the etching, a gate electrode 3' is left on the surface of the substrate.

Subsequently, the photoresist mask 4' is removed and, as indicated in FIG. 2(c), dopant impurities producing the same conductivity type as the conductivity type of the active layer 2 are implanted in the substrate 1. The gate electrode 3' functions as an implantation mask so that the doped regions 5 and 5' on opposite sides of the gate electrode 3' are formed In accordance with conventional processing, an annealing step follows in which the temperature of the substrate is raised to activate the implanted dopant impurities and to repair crystalline damage inflicted by the ion implantation step. The doped regions 5 and 5' have a dopant concentration larger than that of the active layer 2.

A film 6, shown in FIG. 2(d), preferably an electrically insulating film, is deposited on the surface of the substrate 1 and on the gate electrode 3' by a conventional process, such as vapor deposition. The film is etched by RIE. As well known in the art, by controlling the degree of etching, the film 6 can be removed from the gate electrode 3' and from the surface of the substrate 1, leaving side wall films 6' disposed on the surface of the substrate, adjacent to and contacting opposite sides of the gate electrode 3', as shown in FIG. 2(e). Generally, those side wall films 6' have a width comparable to the thickness of the film 6.

The gate electrode 3' and the side wall films 6' are used as an implantation mask and, in another implantation step, dopant impurities producing the same conductivity type as the conductivity type of the active layer 2 are implanted in the substrate. This implantation step produces doped regions 7 and 7' on opposite sides of the gate electrode 3' and the side wall films 6'. The dopant impurity concentration within regions 7 and 7' is larger than the dopant concentration in the regions 5 and 5'. Portions of the doped regions 5 and 5' protected by the respective side wall films 6' are left in the substrate adjacent to and electrically connecting the doped regions 7 and 7' to the active layer 2, respectively. The resulting structure appears in FIG. 2(f).

Finally, as shown in FIG. 2(g), the FET is completed by the formation of source and drain electrodes 8a and 8b in contact with the most heavily doped regions 7 and 7', respectively. Regions 7 and 7' are the source and drain regions, respectively, of the FET.

The LDD FET structure of FIG. 2(g) is useful in suppressing the short channel effect in FETs that causes variations in the threshold voltage of the transistor as the gate length becomes smaller than a few microns. In addition, the short channel effect causes the threshold voltage of the FET to depend upon the voltage between the source and drain, affects the current cut-off capability of the FET, and increases the drain conductance. These effects still appear in LDD FETs having gate lengths below about 1 micron. In the FET shown in FIG. 2(g), current leakage through the semi-insulating GaAs substrate 1 between the doped regions 5, 5', 7, and 7' directly below the active layer 2 contribute to the undesirable characteristics collectively referred to as the short channel effect.

An additional known FET structure for suppressing the short channel effect by preventing the flow of leakage currents in a semi-insulating substrate is shown in cross-section in FIG. 3. That FET has the same structure as the transistor of FIG. 2(g) and additionally includes a doped region 9 within the substrate adjacent to and contacting each of the regions 7, 5, 5', and 7' as well as the active layer 2. The doped region 9 has a conductivity type opposite the conductivity type of the active layer 2 and the regions 7, 5, 5', and 7', thereby forming a large area pn junction. The pn junction prevents the flow of leakage current within the substrate and further suppresses the short channel effect for gate lengths as short as about 0.5 micron. However, the presence of the doped region 9 in the substrate forming a relatively large area pn junction significantly increases the capacitance between the source and gate electrodes 8a and 3'. The increase capacitance limits the upper end of the frequency range in which the FET can be used.

In order to overcome the reduction in frequency range brought about by the inclusion of the doped region 9 in the substrate 1, the FET structure shown in FIG. 4 has been proposed. In the structure of FIG. 4, the doped region 9 within the substrate 1 is present in the substrate only beneath and contacting the doped regions 5' and 7' and a part of the active layer 2 that is near the interface of the active layer 2 and the doped region 5'. Because the doped region 9 is not present beneath the source region 7, the capacitance between the source electrode 8a and the gate electrode 3' is not substantially increased by the presence of the doped region 9. However, the doped region 9 substantially prevents the flow of leakage current through the substrate because of the pn junction interposed between the doped regions on the source side of the FET and the doped regions on the drain side of the FET. Thus, the short channel effect is minimized without adversely affecting the high frequency performance of the FET.

A method of making the FET structure of FIG. 4 is illustrated in FIGS. 5(a)-5(g). Initially, as indicated in FIG. 5(a), an ion implantation mask 11' is formed. A photoresist film 11 (not shown) is deposited and patterned using conventional techniques to produce the photoresist ion implantation mask 11'. Afterwards, ion producing the second conductivity type region 9, usually a p-type region, are implanted in the substrate 1.

Mask 11, is removed and subsequently the steps illustrated in FIGS. 2(b)-2(g) are carried out as illustrated and described with respect to FIGS. 5(b)-5(g). Since those steps have already been described, it is not necessary to describe them again. However, in carrying out those steps, particularly the step illustrated in FIG. 2(b) as applied in FIG. 5(b), a mask alignment step is required In order to produce the structure of FIG. 4, the doped region 9 must extend slightly beneath the gate electrode 3'. In other words, the photoresist pattern 4' used to define the gate 3' must be aligned with the buried doped region 9 that has already been formed in the substrate. If the alignment is not precisely made, the structure of FIG. 6, rather than the structure of FIG. 4, may be produced In the structure of FIG. 6, the doped region 9 is present within the substrate 1 only adjacent part of the doped region, i.e., the drain region, 7'. Part of the doped regions 5' and 7' are still in direct contact with the semi-insulating substrate 1 and leakage currents can still flow through the substrate 1 between the source region 7 and drain region 7'. Alternatively, as shown in FIG. 7, if an alignment error opposite in direction from the error that produces the structure of FIG. 6 occurs, the doped region 9 may extend all the way to the source region 7, causing an undesired increase in source-to-gate capacitance.

As is apparent from the foregoing discussion, a method of producing the structure of FIG. 4 without the problem of aligning a gate electrode mask with the doped region 9 is desired in order to produce the structure of FIG. 4 reliably, minimizing the short channel effect in narrow gate FETs without adversely affecting the high frequency performance of those transistors.

SUMMARY OF THE INVENTION

An object of the present invention is to provide a method of producing an FET including, in a semi-insulating substrate, a doped region that is precisely located with respect to the drain region so that leakage current flow through the substrate between the source and drain regions is minimized without increasing the capacitance between the source and drain electrodes. It is an important object of the invention that the method reliably and precisely reproduce the doped region relative to the drain region without the requirement of a mask alignment step.

According to one aspect of the invention, a method of producing a field effect transistor includes forming a first conductivity type active layer having a first concentration of dopant impurities producing the first conductivity type in a semi-insulating semiconductor substrate, forming a mask film on the surface of the substrate on part of the first conductivity type region, depositing a gate metal film on the mask film and on the substrate not covered by the first mask film, etching the gate metal film and leaving a portion of the gate metal film on the surface of the substrate adjacent to and contacting the mask film as a gate electrode, implanting dopant impurities producing a second conductivity type opposite the first conductivity type in the substrate using the mask film and the gate electrode as an implantation mask, annealing the substrate at an elevated temperature to activate the implanted dopant impurities whereby some of the implanted dopant impurities diffuse laterally within the substrate to produce a second conductivity type region in the substrate underneath part of the gate electrode, removing the mask film, implanting dopant impurities producing the first conductivity type in the substrate using the gate electrode as an ion implantation mask to produce first and second doped regions in the substrate on opposite sides of the gate electrode and having a second concentration of dopant impurities larger than the first concentration, the second doped region being disposed within the second conductivity type region that extends underneath part of the gate electrode, and forming a source electrode on the first doped region and a drain electrode on the second doped region.

According to another aspect of the invention, the method of producing a field effect transistor may include steps producing an LDD structure. The LDD structure is produced before the source and drain electrodes are formed by depositing a second mask film on the substrate on both sides of the gate electrode and on the gate electrode, etching the second mask film, leaving portions of the second mask film on the substrate adjacent to and contacting first and second opposed sides of the gate electrode, and implanting dopant impurities producing the first conductivity type in the substrate using the gate electrode and the portions of the second mask film as an ion implantation mask to form first conductivity type third and fourth doped regions in the substrate on opposite sides of the gate electrode and having a third concentration of dopant impurities larger than the second concentration, the fourth region being disposed within the second conductivity type region that extends underneath part of the gate electrode.

Other objects and advantages of the present invention will become apparent from the detailed description that follows The detailed description and specific embodiments are provided for illustration only and various modifications and additions within the spirit and scope of the invention will become apparent from the detailed description.

BRIEF DESCRIPTION OF THE DRAWINGS

FIG. 3 is a cross-sectional view of a prior art FET.

FIG. 4 is a cross-sectional view of an FET that can be produced according to the present invention.

FIGS. 6 and 7 are cross-sectional views of FETs that may be produced by the process illustrated in FIGS. 5(a)-5(g) when mask alignment errors occur.

DESCRIPTION OF THE PREFERRED EMBODIMENTS

FIGS. 1(a)-1(i) illustrate a method of manufacturing an FET according to the present invention. In these and all other figures, the same reference numbers are given to corresponding elements. Accordingly, it is not necessary to describe in detail the elements of FIGS. 1(a)-1(i) that have already been described with respect to other figures.

Figure 1A:
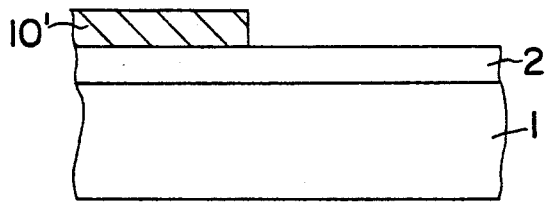
FIGS. 1(a)-1(i) are sectional views illustrating a method of producing an FET according to an embodiment of the present invention.

In FIG. 1(a), an active layer 2 has been formed in a semi-insulating compound semiconductor substrate 1, specifically a GaAs substrate, preferably by ion implantation. The active layer 2 may also be formed by the diffusion of dopant impurities into the substrate 1 or by epitaxial growth at the surface of the substrate. The active layer 2 contains dopant impurities producing a first conductivity type, generally n-type. For example, silicon (Si) ions may be implanted as a dopant impurity in GaAs to form the active layer 2. The Si ions are accelerated to about 50 kev and have a flux density of about $1.5 \times 10^{12}$ ions/cm$^2$. The resulting active layer 2 is about 80 nanometers (nm) deep.

Subsequently, a first mask film 10 (not shown), preferably of an electrically insulating material, that can function as an ion implantation mask is deposited on the active layer using a conventional process, such as a plasma chemical vapor deposition (CVD) process. The mask film 10 may be, for example, SiO, SiO$_x$, SiO$_2$, or SiN$_x$. The mask film 10 is etched, for example, by RIE, using a conventional technique, for example, in a mixture of equal quantities of SiF$_6$ and helium (He), at a pressure of 0.3 Torr with about 50 watts of radio frequency (RF) power supplied to the plasma. After the etching, an ion implantation mask 10' is left on part of the surface of the substrate 1.

Figure 1B:
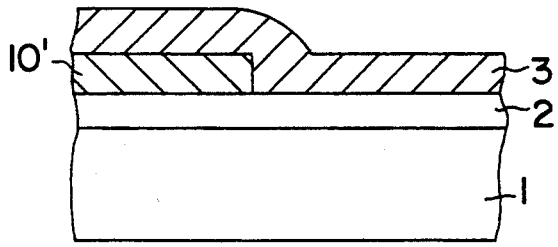

A gate metal film 3, for example, of a refractory metal or a refractory metal silicide, such as W or WSi$_x$, is deposited over the mask 10' and the exposed surface of the substrate 1, as shown in FIG. 1(b). The refractory metal or refractory metal silicide film may be deposited by known processes, including DC sputtering at about 400 watts power in argon (Ar) at a pressure of about 10 mTorr or by vapor deposition.

Figure 1C:
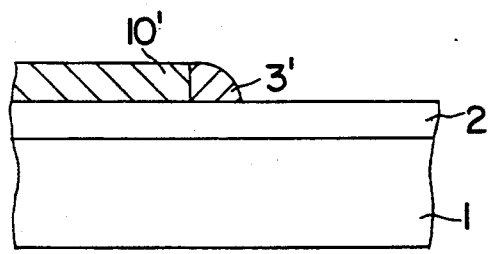

The gate metal film 3 is etched by RIE so that the metal is substantially completely removed from the mask 10' and from most of the surface of the substrate 1, leaving a gate electrode 3' in place on the surface of the substrate 1 adjacent to and contacting the first film mask 10'. The refractory metal or refractory metal silicide gate metal film may be etched in a mixture of CF$_4$ and four percent O$_2$ driven by about 75 watts of RF power or in SF$_6$. The gate length of the gate electrode 3', i.e., the dimension along the surface of the substrate 1 shown in FIG. 1(c), is approximately the thickness of the gate metal film 3. Accordingly, a submicron gate width can be produced in the invention.

Figure 1D:
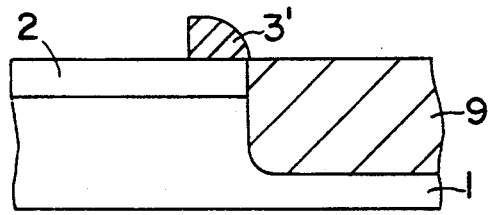

The doped region 9 of a second conductivity type, opposite the conductivity type of the active layer 2, is formed by ion implantation, as illustrated in FIG. 1(d). Before the removal of the first film mask 10', that mask and the gate electrode 3' are used as an ion implantation mask and dopant impurities producing the second conductivity type in the substrate are implanted to form region 9. For example, when region 9 is p-type, magnesium (Mg) ions having an energy of about 300 keV and a flux density of about $4 \times 10^{12}$ ions/cm$^2$ are implanted. Those ions produce a region 9 having a depth of approximately 800 nm. In order to activate those ions and repair crystalline damage produced by the ion implantation, the structure of FIG. 1(d) is annealed. During that elevated temperature annealing step, the implanted ions diffuse within the substrate 1. As shown in FIG. 1(d), that diffusion carries the doped region 9 laterally and underneath a portion of the gate electrode 3'. Following the annealing step, the film mask 10' is removed by etching, preferably by wet etching.

Using the gate electrode 3' as an ion implantation mask, first and second doped regions 5 and 5' are formed in the substrate on opposite sides of the gate electrode 3'. The impurity dopant concentration in regions 5 and 5' is higher than the dopant concentration of the active layer 2. The first and second doped regions 5 and 5' may be formed, for example, by implanting Si ions having an energy of about 60 keV and a flux density of about $2 \times 10^{12}$ ions/cm$^2$. Using these conditions, the regions 5 and 5' extend from the surface of the substrate 1 to a depth of about 100 nm. As is apparent from FIGS. 1(d) and 1(e), because the second conductivity type doped region 9 extends partially underneath the gate electrode 3 and the gate electrode 3' functions as an ion implantation mask in the formation of the first conductivity type doped region 5', the region 5' is buried within the doped region 9. In other words, the method is self-aligning with respect to ensuring that the first conductivity type doped region 5' is isolated from the substrate 1 by the second conductivity type doped region 9. Following the ion implantation step producing the doped regions 5 and 5', another annealing step is carried out to activate the implanted dopant impurities, to repair crystalline damage, and to complete the structure shown in FIG. 1(e).

Figure 1E:
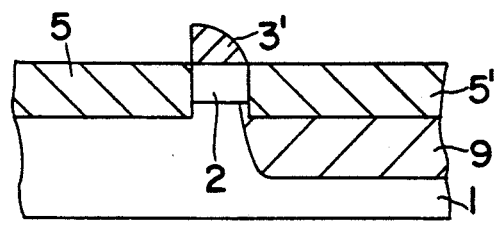

The structure of FIG. 1(e) can be employed as a completed FET if source and drain electrodes 8a and 8b are formed on the doped regions 5 and 5' as the source and drain regions, respectively. If the structure of FIG. 1(e) is used directly, after the application of electrodes, as an FET, it is desirable to increase the doping concentration of regions 5 and 5' over that previously described. For example, the dopant concentration levels of the doped regions 7 and 7' described below would preferably be used to produce an FET without an LDD feature. The steps described below with respect to FIGS. 1(f)-1(h) are employed to produce an FET including an LDD feature.

Figure 1F:
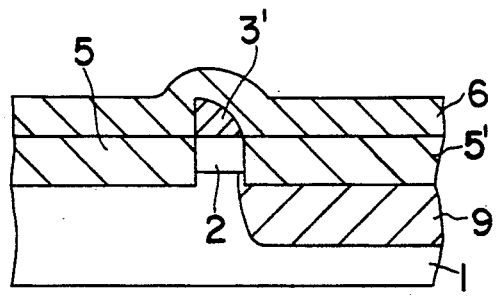

Turning to FIG. 1(f), a second mask film 6, preferably an electrically insulating film of the same composition of the first film mask 10, is deposited on the surface of the substrate 1 and the gate electrode 3'. The second mask film 6 is anisotropically etched, for example, by RIE, in a plasma formed in a gas mixture of CHF$_6$ and ten percent O$_2$ at a pressure of about 75 Torr and driven by RF power of about 100 watts. That etching removes the film 6 from the surface of the substrate and the top surface of the gate electrode 3', leaving in place portions 6' on the surface of the substrate and adjacent to the gate electrode 3' at each of two opposite sides. These side wall films 6', shown in FIG. 1(g), function as ion implantation masks in the third and final ion implantation step.

Figure 1G:
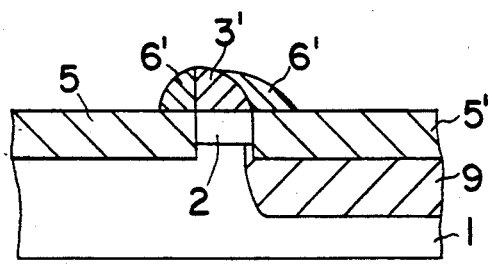
Figure 1H:
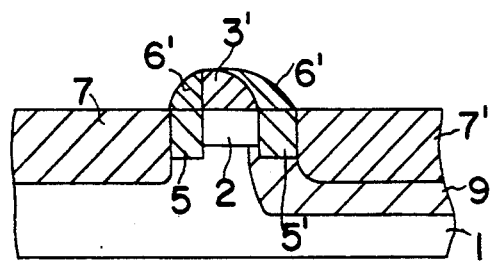
Figure 1I:
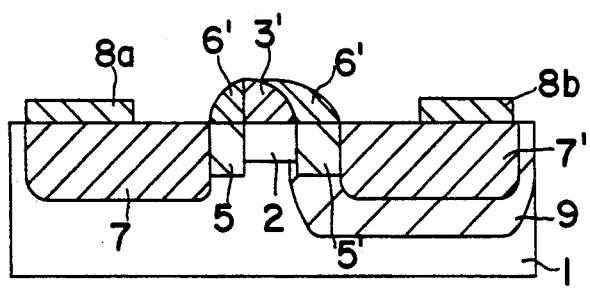
Figure 2A:
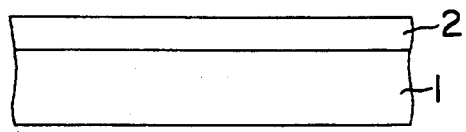
FIGS. 2(a)-2(g) are sectional views illustrating a method of producing an FET according to the prior art.
Figure 2B:
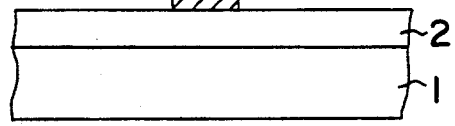
Figure 2C:
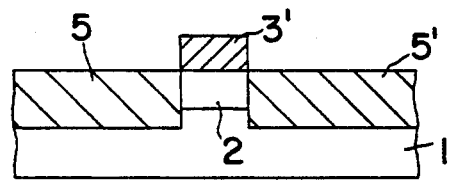
Figure 2D:
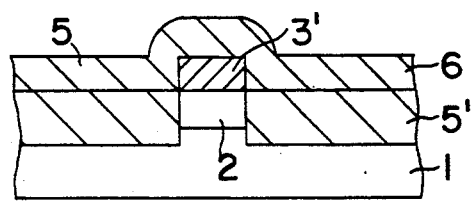
Figure 2E:
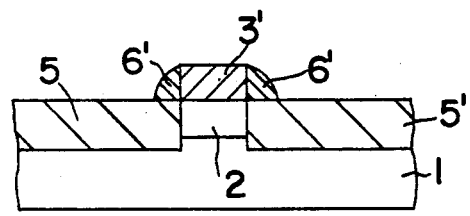
Figure 2F:
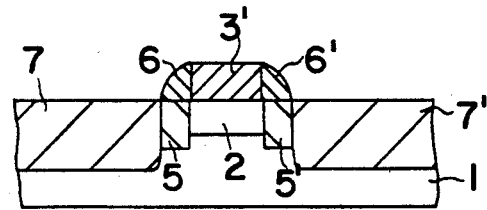
Figure 2G:
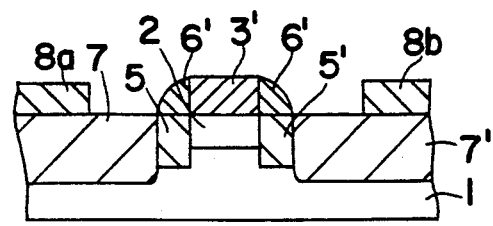
Figure 5A:
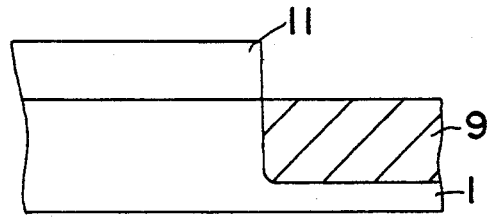
FIGS. 5(a)-5(g) illustrate a method of making the FET of FIG. 4.
Figure 5B:
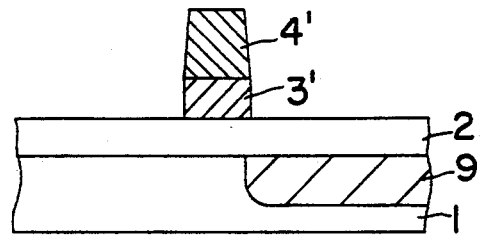
Figure 5C:
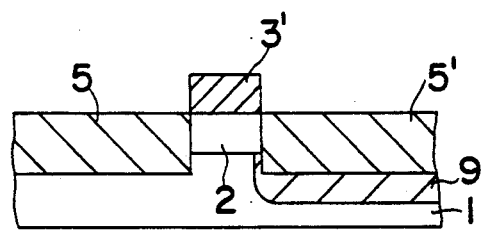
Figure 5D:
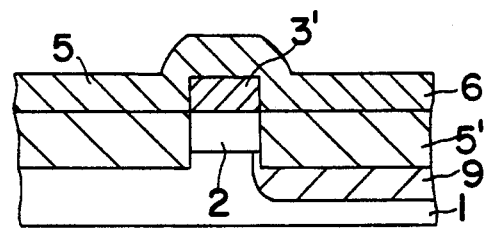
Figure 5E:
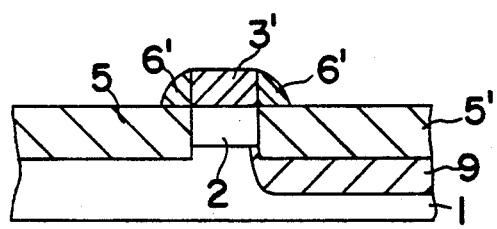
Figure 5F:
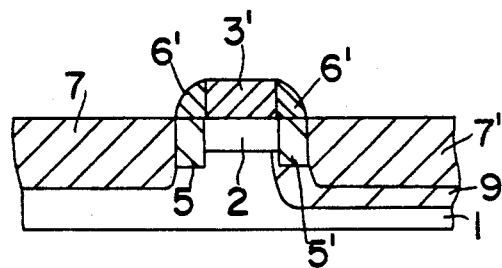
Figure 5G:
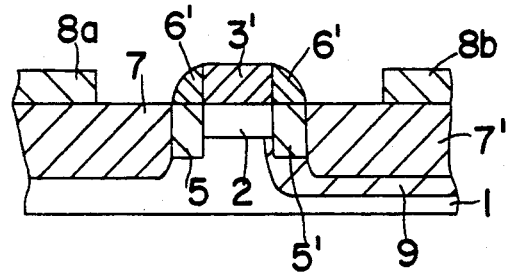

That third ion implantation step is illustrated in FIG. 1(h) in which dopant impurities producing in the substrate the first conductivity type are implanted using the gate electrode and side wall films 6' as a mask. As an example, Si ions may be implanted at an energy of about 150 keV and a flux density of about $3 \times 10^{13}$ ions/cm$^2$, producing the doped regions 7 and 7' shown in FIG. 1(h) to a depth of about 120 nm. The dopant impurity concentration in regions 7 and 7' exceeds the dopant concentrations in regions 5 and 5'. Residual portions of those doped regions 5 and 5' are thus sandwiched between the active layer 2 and regions 7 and 7', respectively, to form an LDD FET structure. After a final annealing step to activate the implanted ions, a source electrode 8a is deposited on the doped region 7, i.e., the source region, and a drain electrode 8b is formed on the doped region 7', i.e., the drain region. As shown in FIGS. 1(h) and 1(i), because the depth of the doped region 7' is shallower than that of the doped region 9, the second conductivity type doped region 9 envelopes both the residual region 5' and the region 7' so that no leakage current can flow through the semi-insulating substrate 1 directly between the source region 7 and the drain region 7' or the intermediately doped region 5'.

Figure 7:
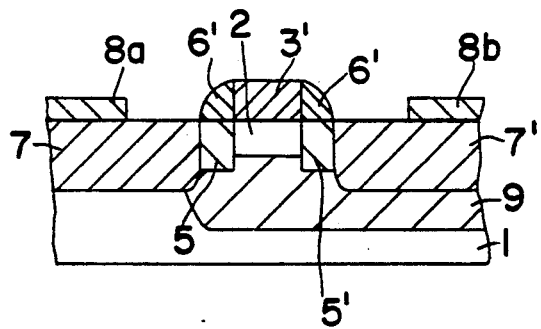

The process described for producing the FET structure of FIG. 4, whether the LDD elements 5 and 5' and masking film portions 6' are present, does not rely on or require any photolithographic mask alignment steps that could result in the undesired FET structures illustrated in FIGS. 6 and 7. 15 The absence of the LDD elements in a simpler FET structure, achieved by depositing the electrodes 8a and 8b illustrated in FIG. 1(i) directly on the structure of FIG. 1(e), with the omission of the steps illustrated in FIGS. 1(f)-1(h), does not alter the advantages achieved in the invention.

As described above, by using the self-aligning process described, the advantage of eliminating the flow of leakage current within the substrate, thereby minimizing the short channel effect, without increasing the capacitance between the source electrode and gate electrode, is reliably and reproducibly achieved.

I claim:

1. A method of producing a field effect transistor comprising:
   forming a first conductivity type active layer having a first concentration of dopant impurities producing the first conductivity type in a semi-insulating semiconductor substrate;
   forming a mask film on the substrate on part of the first conductivity type region;
   depositing a gate metal film on the mask film and on the substrate not covered by the mask film;
   etching the gate metal film and leaving a portion of the gate metal film on the substrate adjacent to and contacting the mask film as a gate electrode;
   implanting dopant impurities producing a second conductivity type opposite the first conductivity type in the substrate using the mask film and the gate electrode as an implantation mask;
   annealing the substrate at an elevated temperature to activate the implanted dopant impurities whereby some of the implanted dopant impurities diffuse laterally within the substrate to produce a second conductivity type region in the substrate underneath part of the gate electrode;
   removing the mask film;
   implanting dopant impurities producing the first conductivity type in the substrate using the gate electrode as an ion implantation mask to produce first and second doped regions in the substrate on opposite sides of the gate electrode and having a second concentration of dopant impurities larger than the first concentration, the second doped region being disposed within the second conductivity type region that extends underneath part of the gate electrode; and
   forming a source electrode on the first doped region and a drain electrode on the second doped region.

2. The method of claim 1 including depositing one of a refractory metal and refractory metal silicide on the substrate as the gate metal film.

3. The method of claim 1 including reactive ion etching the gate metal film to form the gate electrode.

4. The method of claim 1 wherein the semiconductor substrate is a III-V compound.

5. The method of claim 4 wherein the substrate is GaAs.

6. The method of claim 1 including implanting dopant impurities producing p-type conductivity in the substrate using the mask film and the gate electrode as an implantation mask.

7. The method of claim 1 including implanting dopant impurities in the substrate to produce the active layer.

8. The method of claim 1 wherein the first doped region is the source region of the field effect transistor and the second doped region is the drain region of the field effect transistor.

9. A method of producing a field effect transistor comprising:
   forming a first conductivity type active layer having a first concentration of dopant impurities producing the first conductivity type in a semi-insulating semiconductor substrate;
   forming a first mask film on the substrate on part of the first conductivity type region;
   depositing a gate metal film on the first mask film and on the substrate not covered by the first mask film;
   etching the gate metal film and leaving a portion of the gate metal film on the substrate adjacent to and contacting the first mask film as a gate electrode;
   implanting dopant impurities producing a second conductivity type opposite the first conductivity type in the substrate using the first mask film and the gate electrode as an implantation mask;
   annealing the substrate at an elevated temperature to activate the implanted dopant impurities whereby some of the implanted dopant impurities diffuse laterally within the substrate to produce a second conductivity type region in the substrate underneath part of the gate electrode;
   removing the first mask film;
   implanting dopant impurities producing the first conductivity type in the substrate using the gate electrode as an ion implantation mask to produce first and second doped regions in the substrate on opposite sides of the gate electrode and having a second concentration of dopant impurities larger than the first concentration, the second doped region being disposed within the second conductivity type region that extends underneath part of the gate electrode;
   depositing a second mask film on the substrate on both sides of the gate electrode and on the gate electrode;
   etching the second mask film, leaving portions of the second mask film on the substrate adjacent to and contacting first and second opposed sides of the gate electrode;
   implanting dopant impurities producing the first conductivity type in the substrate using the gate electrode and the portions of the second mask film as an ion implantation mask to form first conductivity type third and fourth doped regions in the substrate on opposite sides of the gate electrode and having a third concentration of dopant impurities larger than the second concentration, the fourth region being disposed within the second conductivity type region that extends underneath part of the gate electrode; and forming a source electrode on the third doped region and a drain electrode on the fourth doped region.

10. The method of claim 9 including depositing one of a refractory metal and refractory metal silicide on the substrate as the gate metal film.

11. The method of claim 9 including reactive ion etching the gate metal film to form the gate electrode.

12. The method of claim 9 wherein the semi-conductor substrate is a III-V compound.

13. The method of claim 12 wherein the substrate is GaAs.

14. The method of claim 9 including implanting dopant impurities producing p-type conductivity in the substrate using the first mask film and the gate electrode as an implantation mask.

15. The method of claim 9 including implanting dopant impurities in the substrate to produce the active layer.

16. The method of claim 9 wherein the third doped region is the source region of the field effect transistor and the fourth doped region is the drain region of the field effect transistor.

17. The method of claim 9 including reactive ion etching the second mask film to produce the portions of the second mask film on the substrate adjacent the gate electrode.

* * * * *